United States Patent [19]
Tominaga et al.

[11] 4,276,533
[45] Jun. 30, 1981

[54] PRESSURE SENSOR

[75] Inventors: Tamotsu Tominaga; Teruyoshi Mihara, both of Yokohama; Takeshi Oguro, Yokosuka; Masami Takeuchi, Kokubunji, all of Japan

[73] Assignee: Nissan Motor Company, Limited, Kanagawa, Japan

[21] Appl. No.: 116,795

[22] Filed: Jan. 30, 1980

[30] Foreign Application Priority Data

Feb. 2, 1979 [JP] Japan ................................. 54/10329

[51] Int. Cl.³ .............................................. G01L 1/22
[52] U.S. Cl. ........................................ 338/4; 73/727; 338/42
[58] Field of Search ............................... 338/2–5, 338/36, 42; 73/720, 721, 726, 727; 357/26

[56] References Cited

U.S. PATENT DOCUMENTS

| | | | |
|---|---|---|---|
| 4,021,766 | 5/1977 | Aine | 338/4 X |
| 4,040,297 | 8/1977 | Karsmakers | 338/4 X |
| 4,129,042 | 12/1978 | Rosvold | 73/727 X |
| 4,135,408 | 1/1979 | DiGiovanni | 338/42 X |

FOREIGN PATENT DOCUMENTS

| | | | |
|---|---|---|---|
| 2630640 | 1/1977 | Fed. Rep. of Germany | 73/727 |
| 2913772 | 10/1979 | Fed. Rep. of Germany | 73/727 |
| 1248087 | 9/1971 | United Kingdom | 73/727 |

Primary Examiner—C. L. Albritton
Attorney, Agent, or Firm—Schwartz, Jeffery, Schwaab, Mack, Blumenthal & Koch

[57] ABSTRACT

A diaphragm assembly includes a silicon diaphragm block which has a diaphragm at an eccentric position thereof, a diffused resistor formed as a pressure-sensitive element on a front surface of the diaphragm, and a silicon support plate bonded to the diaphragm block so as to cover a back surface of the diaphragm. The diaphragm assembly is accommodated sealingly within and bonded to the inside of a hollow package at an end portion of the assembly remote from the diaphragm in the direction of extension of the bonded surfaces of the block and the support plate. The front surface of the diaphragm and the diffused resistor thereon are exposed to a vacuum while a fluid pressure subject to measurement is introduced through a passage extending through the package and the end portion of the assembly bonded to the package so as to arrive at a back surface of the diaphragm.

10 Claims, 10 Drawing Figures

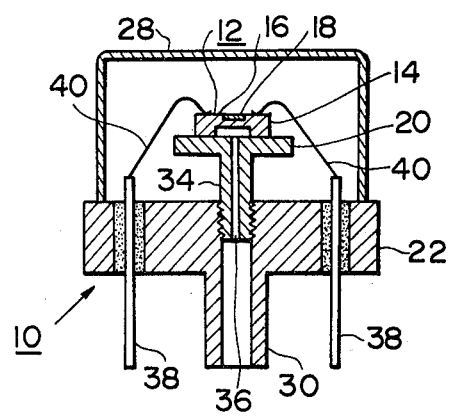
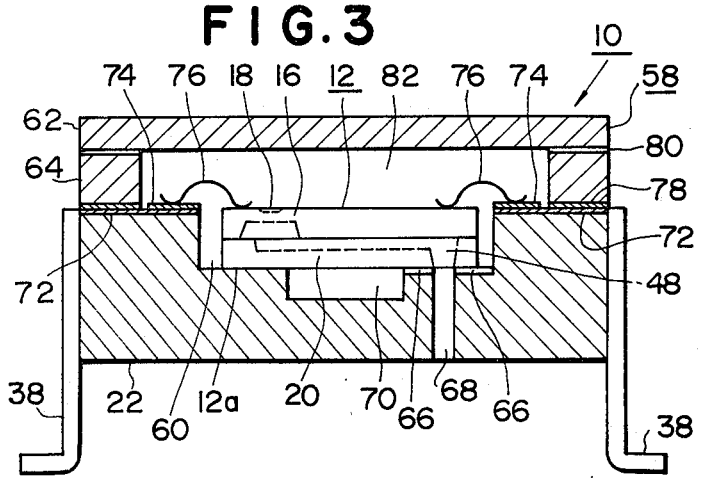
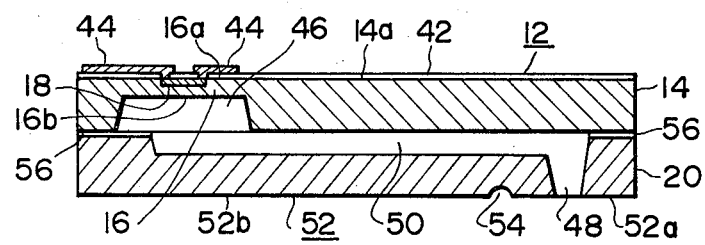

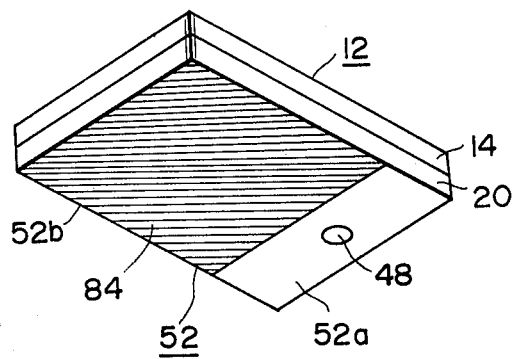
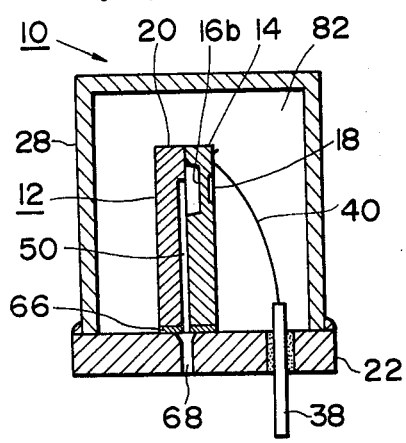
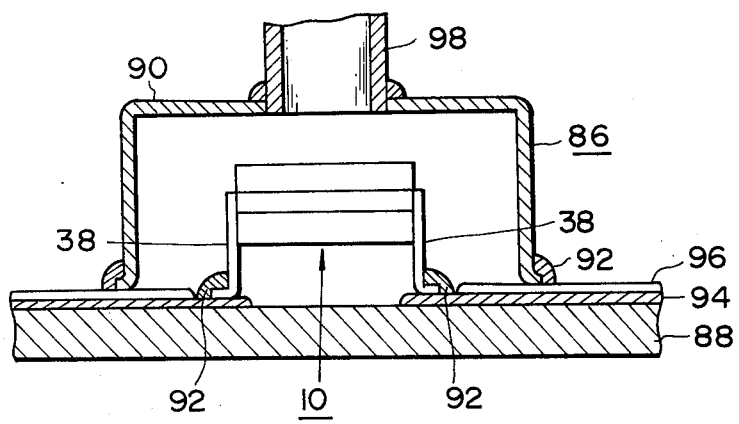

PRESSURE SENSOR

BACKGROUND OF THE INVENTION

The present invention relates to a pressure sensor using the piezoresistivity effect of a semiconductor material, and more particularly to a pressure sensor having a silicon diaphragm, on one surface of which a diffused resistor is formed as a pressure-sensitive element which converts a fluid pressure applied to the diaphragm to a corresponding electrical signal, by sensing changes in the resistance of the diffused resistor due to stress occurring therein.

This type of sensor is relatively small and of good sensitivity. These sensors can easily be manufactured in large quantities and to high standards of uniformity using integrated circuit manufacturing techniques. These excellent features have received engineering attention, and research in their practical use has been done in many factories and research institutes. One of the problems to be solved with this sensor is its thermal characteristics. That is, if the silicon diaphragm and a base to which the silicon diaphragm is secured have different linear coefficients of thermal expansion, thermal stresses will occur in the diaphragm due to a change in its temperature, and thus the output of the sensor will fluctuate. In order to avoid the influence of such thermal change, materials whose linear coefficient of thermal expansion is very close to that of silicon have been used for the mounting base; for example, mullite, zircon and Pyrex glass (trade mark). However, the above-mentioned materials for the diaphragm and its mounting base, respectively, still have nonuniformities in linear coefficient of thermal expansion, which are difficult to remove completely. When the mounting base used is made of a ceramic material such as mullite, zircon or Pyrex glass, the bonding layer between the base and the diaphragm must be relatively thick because of the roughness of the surface of the base. Thus the diaphragm is still susceptible to thermal expansion of the bonding layer and therefore this technique has not succeeded in sufficiently reducing thermal stress in the diaphragm.

Other proposals for improving the thermal characteristics of the diaphragm have been made which involve mounting the diaphragm on a silicon support plate having the same linear coefficient of thermal expansion as the diaphragm. FIG. 1 of the accompanying drawings shows one such proposal where a pressure sensor 10 includes a diaphragm assembly 12 which consists of a silicon diaphragm block 14 having a diaphragm 16 on which diffused resistors 18 are formed and a silicon support plate 20 bonded to the opposite surface of the diaphragm block 14 by an Au-Si (gold-silicon) eutectic alloy layer (not shown), an alumina base 22 to which the diaphragm assembly 12 is sealingly bonded at its center on its back surface by a bonding material 24. The space 26 between the diaphragm block and the support plate is evacuated. The surface of the diaphragm on which the diffused resistors 18 are formed is covered by a cap 28 secured to the base. A fluid pressure subject to measurement is introduced through an inlet pipe 30 and a hole 32 provided in the base 22 and transmitted to the diaphragm 16 and therefore the diffused resistors 18.

In this sensor, the diaphragm and the support plate are made of a material of the same linear coefficient of thermal expansion, a single crystal silicon, and therefore the diaphragm is less susceptible to thermal stress than if the diaphragm were bonded to a mounting base of a material of different linear coefficient of thermal expansion. However, since the diffused resistors are exposed to a fluid whose pressure is subject to measurement, they are liable to deteriorate due to moisture and corrosive gases possibly contained in the fluid. Thus, this sensor is not suitable for use in an oxidizing atmosphere discharged from an internal combustion engine for the purpose of sensing the pressure thereof.

Another prior art pressure sensor 10 shown in FIG. 2 includes a silicon diaphragm block 14 bonded to a silicon support plate 20 which is formed integrally with a support pillar 34 which in turn is firmly threaded in an alumina base 22. A fluid pressure subject to measurement is introduced through an inlet pipe 30 and a passage 36 provided in the pillar 34 so as to arrive at the back of the diaphragm 16. In this sensor, the surface of the diaphragm on which the diffused resistors 18 are formed is exposed to a vacuum within a cap 28 and therefore the diffused resistors 18 are not deteriorated by the atmosphere fluid subject to measurement. Further, use of a relatively long support pillar 34 serves to reduce the transmission to the silicon diaphragm of thermal stress, produced by the difference in linear coefficient of thermal expansion between the support pillar 34 and the base 22. However, in this sensor, a single piece of the support plate and the pillar must be cut from a single crystal of silicon material, thereby producing a considerable amount of scrap; this is not suitable for mass production. Reference numeral 38 denotes terminals connected through wires 40 to the diffused resistors 18, respectively.

SUMMARY OF THE INVENTION

It is therefore an object of the present invention to provide a pressure sensor in which the diffused resistors formed on a silicon diaphragm are less susceptible to thermal stress, i.e. of improved thermal characteristics.

Another object of the present invention is to provide a pressure sensor in which the diffused resistors on the diaphragm are not deteriorated by an atmosphere subject to measurement.

Still another object of the present invention is to provide an pressure sensor which is suitable for mass production.

BRIEF DESCRIPTION OF THE DRAWINGS

Other objects, features and advantages of the present invention will become more fully understood with reference to the following description of several preferred embodiments thereof, and with reference to the attached drawings, which, however, are not to be taken as limitative of the present invention in any way, but are given for the purposes of illustration and elucidation only. In the drawings:

FIGS. 1 and 2 are cross-sectional views of two different prior art pressure sensors;

FIG. 3 is a cross-sectional view of a first preferred embodiment of a pressure sensor according to the present invention;

FIG. 4 is an enlarged cross-sectional view of a diaphragm assembly used in the pressure sensor of FIG. 3;

FIG. 8 is a perspective view of the diaphragm assembly used in the pressure sensor of FIG. 7;

FIG. 9 is a cross-sectional view of a third embodiment of the pressure sensor according the present invention; and FIG. 10 is a partially cross-sectional view of a pressure sensor assembly in which either of the pressure sensors of FIGS. 3 and 7 is accommodated.

DETAILED DESCRIPTION OF THE EMBODIMENTS

Figure 5:
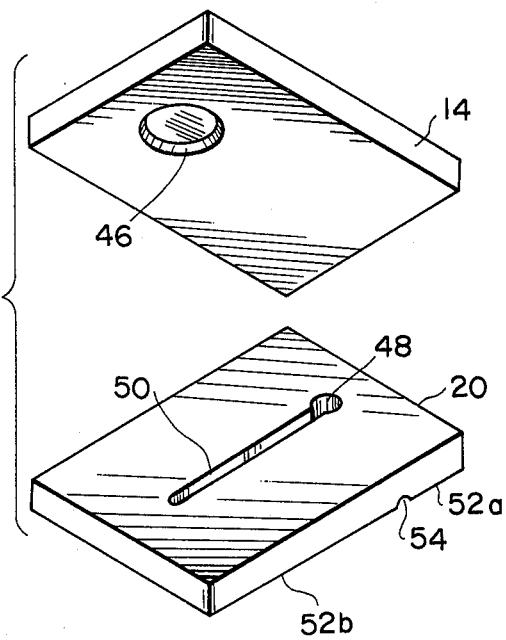
FIG. 5 is an exploded view of the diaphragm assembly used in the pressure sensor of FIG. 3.
Figure 6:
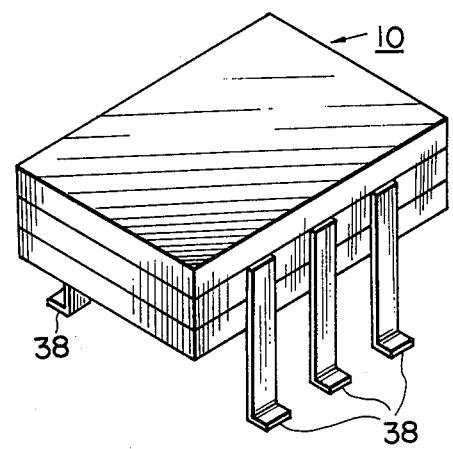
FIG. 6 is a perspective view of the pressure sensor of FIG. 3, illustrated on a reduced scale.

The same reference numeral denotes the same or corresponding parts or elements throughout the drawings. Thus the same or similar description is not repeated.

Referring to FIG. 3 of the drawings, a first preferred embodiment of a pressure sensor according to the present invention is shown designated generally by 10. This sensor 10 includes a diaphragm assembly 12, illustrated best in FIGS. 4 and 5, whose diaphragm block 14 of single crystal silicon is provided on a front surface 16a of its diaphragm 16 with diffused resistors 18, a $SiO_2$ (dioxide silicon) film 42 formed on the resistors 18 and on the diaphragm block 14, and aluminium leads 44 connected to the resistors 18 and formed using known techniques. The other surface 16b of the diaphragm 16 is exposed to a fluid pressure subject to measurement, formed by a recess 46 in the diaphragm block 14 using known etching techniques. The diaphragm is preferably located at an eccentric position in the diaphragm block in the vicinity of one thereof, as shown.

The diaphragm assembly 12 further includes a support plate 20 of single crystal silicon bonded to the diaphragm block 14. The support plate 20 is of the same length and width as the diaphragm block. It is provided with a fluid conducting hole 48 extending therethrough in the direction of thickness of the support plate in the vicinity of the end thereof remote laterally from the diffused resistors 18 and the diaphragm 16. The support plate is further provided on its surface opposite the diaphragm block with a fluid conducting groove 50 communicating at one end with the recess 46 in the diaphragm block 14 and at the other end with the fluid conducting hole 48. The support plate has at one end portion a sufficiently polished outer surface portion 52a surrounding the hole 48 and to be bonded to a package which will be described in more detail. The support plate is preferably provided with a groove 54 on its back surface 52 between the surface portion 52a and the remaining surface portion 52b thereof. All of the hole 48 and the grooves 50 and 54 can be formed using integrated circuit manufacturing techniques such as photo-etching.

In fabrication, the silicon diaphragm block 14 and the silicon support plate 20 are hermetically bonded by an Au-Si (gold-silicon) eutectic alloy layer 56, which is produced by heating an evaporated Au film formed on one of the diaphragm block and the support plate, together with portions of these members adjoining the Au film to a temperature of 380° to 400° C. This diaphragm assembly is enclosed within a package 58 as shown in FIG. 3.

In FIG. 3, the package 58 is composed of a base 22 having a recess 60 on the bottom of which the diaphragm assembly 12 is mounted with sufficient room therearound, a lid 62 covering the diaphragm assembly, and a separator 64 connecting the lid 62 and the base 22. Two groups of terminals 38 are secured to opposite sides of the package. Insulating or ceramic materials be used for the package, should have an appropriate rigidity and substantially the same linear coefficient of thermal expansion as silicon (linear coefficient of thermal expansion of 3 to $4 \times 10^{-6}/°C.$), such as, for example, mullite (linear coefficient of thermal expansion of 3 to $4 \times 10^{-6}/°C.$) or zircon (linear coefficient of thermal expansion of 3.7 to $4.3 \times 10^{-6}/°C.$). The diaphragm assembly 12 is secured at its surface portion 52a to the bottom of the recess 60 in the base 22 by means of a bonding layer 66 which consists of a W (tungsten) or Mo-Mn (molybdenum-manganese) layer metallized on a upper right-hand surface of the base 22, an Ni (nickel) layer plated thereon, and an Au (gold) layer plated on the Ni layer. The Au layer and the silicon support plate 20 form an Au-Si eutectic alloy when heated to a temperature of 380° to 400° C. A fluid conducting passage 68 extends through the base 22 and the bonding layer 66 to the hole 48 which communicates with the groove 50 thereby introducing the fluid pressure subject to measurement to the diaphragm. The base 22 is provided with a smaller recess 70 on the bottom of the larger recess 60 which reduces the area of the surface portion 52a of the diaphragm assembly 12 secured to the bottom of the recess 60. The diaphragm assembly 12 only rests at its other end portion 12a on the bottom of the larger recess 60. W or Mo-Mn metallized wires 72 are provided on the base 22 and electrically connected to terminals 38. Portions of the wires 72 not covered by the separator 64 are plated with an Au layer 74 which is electrically connected to the aluminium leads 44 on the diaphragm block by gold wires 76. After the diaphragm assembly 12 is mounted in the recess 60 of the base 22, this base and the separator 64, and the separator 64 and the lid 62 are bonded by brazing materials 78 and 80 such as a low melting point glass or Au-Sn alloy. These bondings are carried out within a vacuum container (not shown), thereby sealing the package 58 hermetically such that the surface 16a of the diaphragm on which the diffused resistors 18 are formed is exposed to the vacuum 82 within the package 58.

In this sensor, since the diaphragm block 14 and the support plate 20 are made of a single crystal silicon, no thermal stress will be produced therebetween. Since the diaphragm assembly 12 is secured to the base 22 by the bonding layer 66 only at its right-hand end portion remote laterally from the diaphragm, the influence of thermal stress on the diffused resistors 18 which act as a sensitive-element on the diaphragm is very small even if thermal stress may occur in the vicinity of the surface portion 52a of the support plate 20 due to different linear coefficients of thermal expansion of the support plate 20 and the base 22. Thus, this sensor is greatly improved in thermal characteristics compared with a pressure sensor having a diaphragm block and a support plate which are different from each other in linear coefficient of thermal expansion. Provision of the groove 54 between the surface portion 52a of the diaphragm assembly 12 secured to the package 58 and the remaining surface 52b of the diaphragm assembly further serves to prevent the spreading of thermal stress from the surface portion 52a of the diaphragm assembly 12 to the diffused resistors 18.

As mentioned above, a fluid pressure subject to measurement is introduced through the hole 68 in the support plate 22 to the surface 16b of the diaphragm opposite the surface 16a thereof on which the diffused resistors 18 are formed. The surface of the diaphragm on which the diffused resistors 18 are formed is accommodated within the vacuum space 82 of the package 58, and not exposed to the fluid subject to measurement, so that deterioration of the resistors 18 is prevented.

In this sensor, the diaphragm assembly 12 does not include a single piece of silicon of complicated shape such as shown by the integral combination of members 20 and 34 in FIG. 2 which requires complicated cutting techniques; this sensor can easily be manufactured using known integrated circuit manufacturing techniques thereby reducing the amount of scrap produced and being suitable for mass production.

Figure 7:
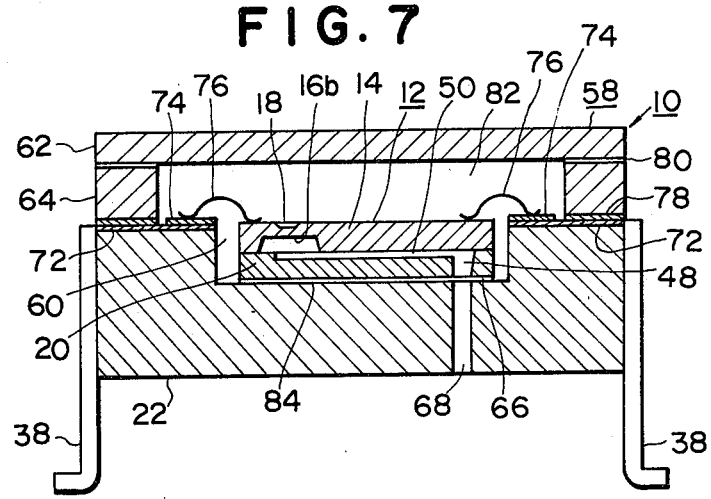
FIG. 7 is a view, similar to FIG. 3, of a second embodiment of the pressure sensor according to the present invention.

In FIGS. 7 and 8 is shown a second embodiment of the pressure sensor of the present invention. This sensor 10 is constructed as follows. A silicon dioxide film 84 (hatched in FIG. 8) is provided on the area 52b of the outer surface 52 of the diaphragm assembly 12. Surface portion 52a of the support plate 20 surrounding the hole 48 is polished, or an evaporated Au layer is formed on the polished surface 52a. As shown in FIG. 7, the diaphragm assembly 12 is accommodated within the recess 60 in the base 22, and the surface portion 52a of the diaphragm assembly is bonded to the base 22 by forming a bonding layer 66 of Au-Si eutectic solution from the Au layer and the portions of the diaphragm assembly and the base which contact the Au layer. In this case, since the SiO₂ film 84 and the Au layer do not form a eutectic alloy, the area of the surface portion 52a of the diaphragm assembly bonded to the base can be determined by the area 52b of the SiO₂ film 84, which eliminates the need for a smaller recess in the base 22 such as shown by 70 in FIG. 3, thereby facilitating manufacture of the package. As the bonding layer 66, in place of an Au layer, a brazing material which does not wet the SiO₂ film 84 may be used. Other structural portions of the second embodiment are substantially the same as the FIG. 3 embodiment.

In FIG. 9 is shown a third embodiment of the present invention. In this sensor, the diaphragm assembly 12 is bonded to a base 22 by a bonding layer 66 at its end surface perpendicular to the direction of extension of the groove 50 therein and remote from the diffused resistors 18. The hole 68 in the base 22 communicates with the groove 50 in the assembly through the bonded surfaces of the diaphragm assembly 12 and the base 22. Thus as in the preceding embodiments, the surface of the diaphragm on which the diffused resistors 18 are formed is hermetically sealed within a vacuum space 82 of a package 58 defined by a cap 28 and the base 22. The diffused resistors 18 and terminals 38 one of which is shown in FIG. 9 are electrically connected to each other through Au wires 40 one of which is shown in the figure. This pressure sensor provides effects similar to those of the preceding embodiments.

In FIG. 10, the pressure sensor 10 of FIG. 3 or 7 is accommodated within a case 86 composed of a base 88, for example, of alumina and a cap 90 secured thereto by a bonding material 92. The terminals 38 are connected by a soldering material 92 to portions of printed conductors 94 for a signal processing circuit, not shown, formed on the base 88 and not covered by glass insulator layers 96 whereby the pressure sensor is supported by the terminals 38. A fluid pressure subject to measurement is introduced through an inlet pipe 98 into the interior of the cap 90 and hence into the hole 68 in the package 58. The diffused resistors 18 on the diaphragm 16 change according to the fluid pressure imparted to the opposite surface of the diaphragm thereby producing a corresponding electrical output.

In the preceding embodiments, the groove 50 is shown as being provided on the support plate 20, but instead it can be provided on the surface of the diaphragm block 14 facing the support plate 20.

Although the present invention has been shown and described with reference to several preferred embodiments, it should not be considered as limited to these, however, or mere and simple generalizations, or other detailed embodiments. Yet further modifications to the form and the content of any particular embodiment could be made, without departing from the scope of the present invention, which it is therefore desired should be defined not by any of the purely fortuitous details of the shown embodiments, or of the drawings, but solely by the appended claims.

What is claimed is:

1. A pressure sensor comprising:
   (a) a diaphragm assembly including a silicon diaphragm block which has a diaphragm, a diffused resistor formed as a pressure-sensitive element on a front surface of the diaphragm, and a silicon support plate bonded to the diaphragm block so as to cover a back surface of the diaphragm, and a first passage communicating from the back of the diaphragm to an opening in the surface of the diaphragm assembly;
   (b) a hollow package sealingly accommodating the diaphragm assembly therein such that the assembly is bonded to the inside of the package at a portion of the assembly remote from the diaphragm in the direction of extension of the bonded surfaces of the block and the support plate, and said portion including the opening to the first passage, and that the front surface of the diaphragm and the diffused resistor thereon are spaced from the inside of the package, and having a second passage formed in the package and communicating from the opening to the first passage to the outside of the package; and
   (c) a plurality of terminals extending outside the package and electrically connecting to the diffused resistor.

2. The pressure sensor of claim 1, wherein the diaphragm and the diffused resistor thereon are positioned substantially at an opposite end of the diaphragm block to said opening to the first passage.

3. The pressure sensor of claim 1, wherein the portion of the diaphragm assembly bonded to the package is a part of the outer surface of the support plate.

4. The pressure sensor of claim 3, wherein the support plate is provided on its said outer surface with a groove forming the boundary between the said part of the outer surface thereof and the remaining surface portion thereof.

5. The pressure sensor of claim 1, wherein the diaphragm assembly has an end surface perpendicular to the bonded surfaces of the diaphragm block and the support plate, the diaphragm assembly being bonded to the inside of the package at said end surface.

6. The pressure sensor of claim 1, wherein the first passage is provided by a groove formed in the surface of the diaphragm block bonded to the support plate.

7. The pressure sensor of claim 1, wherein the package is provided with an interior recess on the bottom of which the diaphragm assembly is disposed.

8. The pressure sensor of claim 7, wherein the recess is provided with a smaller recess in the bottom thereof to limit the area of the part of the outer surface of the diaphragm assembly bonded to the package.

9. The pressure sensor of claim 1, wherein the first passage is provided by a groove formed in the surface of the support plate bonded to the diaphragm block.

10. The pressure sensor of any of claims 1 or 9, wherein the interior of the package is evacuated.

* * * * *